Figure 2:
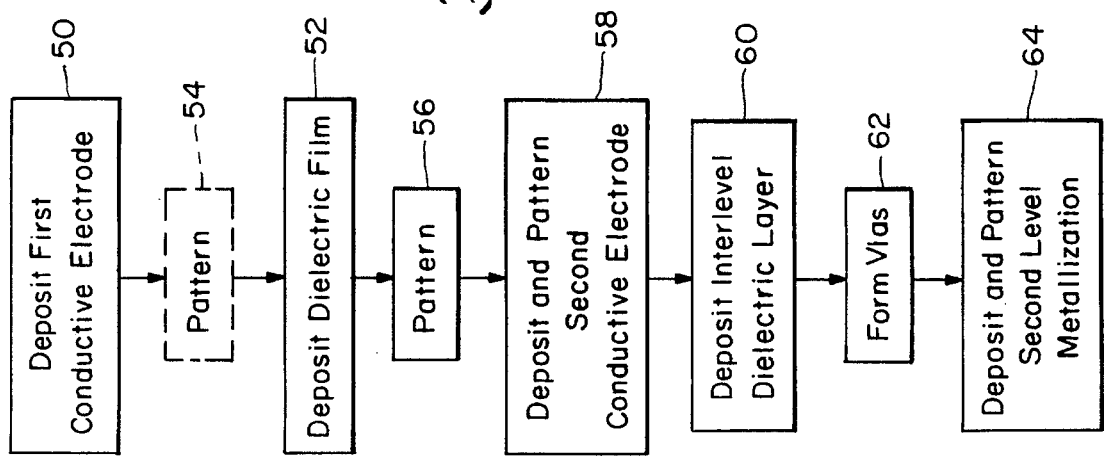

United States Patent [19]

Smrtic et al.

[11] Patent Number: 5,479,316

[45] Date of Patent: Dec. 26, 1995

[54] INTEGRATED CIRCUIT METAL-OXIDE-METAL CAPACITOR AND METHOD OF MAKING SAME

[75] Inventors: Mark A. Smrtic, Stoneham, Mass.; George M. Molnar, Flemington, N.J.; Jerome F. Lapham, Groton, Mass.

[73] Assignee: Analog Devices, Inc., Wilmington, Mass.

[21] Appl. No.: 111,184

[22] Filed: Aug. 24, 1993

[51] Int. Cl.$^6$ .................................................. H01G 4/33
[52] U.S. Cl. ........................... 361/322; 361/303; 361/313; 257/532; 257/535; 29/25.42
[58] Field of Search ....................... 361/303, 305, 361/311, 312, 313, 321.1, 321.5, 322, 304; 257/532, 534, 535; 437/47, 52, 60; 29/25.42

[56] References Cited

U.S. PATENT DOCUMENTS

| | | | |
|---|---|---|---|
| 3,518,498 | 6/1970 | Early | 361/322 |
| 3,864,817 | 2/1975 | Lapham, Jr. et al. | 437/60 |
| 4,638,400 | 1/1987 | Brown et al. | 361/304 |
| 4,731,696 | 3/1988 | Himes et al. | 361/313 |
| 4,785,202 | 11/1988 | Toyoda | 257/532 |
| 4,831,431 | 5/1989 | Hanlon | 257/535 |
| 4,937,649 | 6/1990 | Shiba et al. | 257/535 |
| 4,959,705 | 9/1990 | Lemnios et al. | 257/532 |
| 5,053,917 | 10/1991 | Miyasaka et al. | 361/321.5 |
| 5,086,370 | 2/1992 | Yasaitis | 361/313 |
| 5,369,313 | 11/1994 | Yoshihara | 326/68 |

*Primary Examiner*—Geoffrey S. Evans
*Assistant Examiner*—Gregory L. Mills
*Attorney, Agent, or Firm*—Iandiorio & Teska

[57] ABSTRACT

An integrated circuit metal-oxide-metal capacitor and method of making it which involves a support layer; a first conductive electrode on the support layer; a dielectric film on the first conductive electrode; a second conductive electrode disposed on the dielectric film and formed from the first level metallization interconnect layer of the integrated circuit; an interlevel dielectric layer; a first contact via extending through the interlevel dielectric layer and the dielectric film to the first conductive electrode; a second contact via extending through the interlevel dielectric layer to the second conductive electrode; and first and second terminals formed from the second level metallization interconnect layer of the integrated circuit contacting the first and second vias, respectively.

18 Claims, 1 Drawing Sheet

INTEGRATED CIRCUIT METAL-OXIDE-METAL CAPACITOR AND METHOD OF MAKING SAME

FIELD OF INVENTION

This invention relates to an integrated circuit metal-oxide-metal capacitor and a method of making it.

BACKGROUND OF INVENTION

MOS capacitors are made in standard bipolar integrated circuits by using the emitter diffusion for the lower plate, an oxide grown over the emitter diffusion for the dielectric, and a top plate of aluminum also used for interconnecting the components of the circuit. The advantages of this capacitor are that it requires only one mask and one additional oxidation in addition to the steps required to manufacture a standard bipolar integrated circuit. The disadvantages of this capacitor are that its lower plate has high capacitance to the substrate, and it is sometimes electrically leaky to the substrate. These disadvantages were in part overcome by a capacitor using polycrystalline silicon for the bottom plate (U.S. Pat. No. 3,864,817, Lapham, Jr. et al.).

The standard capacitor cannot be made with circuits that have "washed" emitters because the lower plate structure consisting of emitter diffusion with overlying oxide dielectric is impossible to make. "Washed" emitters are those that have no separate contact masking; the emitter opening constitutes the contact, and it will only function as such with the absence of insulating oxide in the contact.

Further improvements, particularly for MOS applications, have evolved. For example the "double poly" capacitor has both plates made of polycrystalline silicon. This structure, while more complicated, offers low voltage linearity of capacitance and compatibility with MOS circuits. A variation on this structure is the metal oxide polycide capacitor of U.S. Pat. No. 5,086,370 (Yasaitis).

SUMMARY OF INVENTION

It is therefore an object of this invention to provide an improved integrated circuit metal-oxide-metal capacitor and method of making it.

It is a further object of this invention to provide such an improved integrated circuit metal-oxide-metal capacitor which has lower parasitic capacitance and resistance.

It is a further object of this invention to provide such an improved integrated circuit metal-oxide-metal capacitor which is capable of operating at higher switching speeds.

It is a further object of this invention to provide such an improved integrated circuit metal-oxide-metal capacitor which has a low voltage coefficient of capacitance.

It is a further object of this invention to provide such an improved integrated circuit metal-oxide-metal capacitor which is compatible with a "washed" emitter environment.

It is a further object of this invention to provide an improved integrated circuit capacitor with high dielectric constant dielectrics other than $SiO_2$.

It is a further object of this invention to provide such an improved integrated circuit metal-oxide-metal capacitor which readily integrates into a standard double level metal bipolar process with only one additional mask and dielectric deposition.

The invention results from the realization that a truly improved capacitor having lower parasitic capacitance and resistance, high capacity, lower voltage coefficient of capacitance and high speed can be made integral with an associated integrated circuit by employing a first conductive electrode on an insulator layer, a dielectric film on the first electrode, a second conductive electrode formed as a part of the first level metallization interconnect layer of the integrated circuit and first and second terminals formed from the integrated circuit second level metallization layer extending through openings in the integrated circuit interlevel dielectric and dielectric film to contact the electrodes.

This invention features an integrated circuit metal-oxide-metal capacitor which includes a support layer and first conductive electrode on the support layer. There is a dielectric film on the first conductive electrode and a second conductive electrode disposed on the dielectric film and formed from the first level metallization interconnect layer of the integrated circuit to form a capacitor. There is an interlevel dielectric layer with a first contact via extending through the interlevel dielectric layer and through the dielectric film to the first conductive electrode. A second contact via extends through the interlevel dielectric layer to the second conductive electrode. There are first and second terminals formed from the second level metallization interconnect layer of the integrated circuit for contacting the first and second vias, respectively.

In a preferred embodiment the support layer may be an insulator. The insulator may be silicon dioxide. The support layer may be a semi-insulating semiconductor which may be gallium arsenide. The support layer may include a substrate with an insulator layer on one surface. The substrate may be metal or a semiconductor such as silicon. The first conductive electrode may be metal, the metal may be a refractory metal, and the refractory metal may be one from the group including titanium, tungsten, or titanium tungsten. The first conductive electrode may be an intermetallic compound such as titanium nitride. The dielectric film may be silicon dioxide. The second conductive electrode and first level metallization interconnect layer may be aluminum. The first conductive electrode may extend beyond the second conductive electrode; the second via may extend through the dielectric film.

The invention also features a method of fabricating an integrated circuit metal-oxide-metal capacitor including the steps of depositing a first conductive electrode on an insulating surface, depositing a dielectric film on the first conductive electrode, and patterning the first conductive electrode and the dielectric film. A second conductive electrode is deposited and patterned on the dielectric film. The second conductive electrode is formed from the first level metallization interconnect layer of the integrated circuit. The interlevel dielectric layer of the integrated circuit is deposited and first and second vias are formed through the interlevel dielectric layer to reach each of the first and second conductive electrodes, respectively. The second level metallization interconnect layer of the integrated circuit is deposited and patterned to fill the vias and define terminals for the electrodes to establish contact with the rest of the integrated circuit.

In a preferred embodiment the patterning of the first conductive electrode and the dielectric film may occur together, or the first conductive electrode may be patterned before the dielectric film is deposited and the dielectric film may be patterned after the dielectric film is deposited.

DISCLOSURE OF PREFERRED EMBODIMENT

Figure 1:
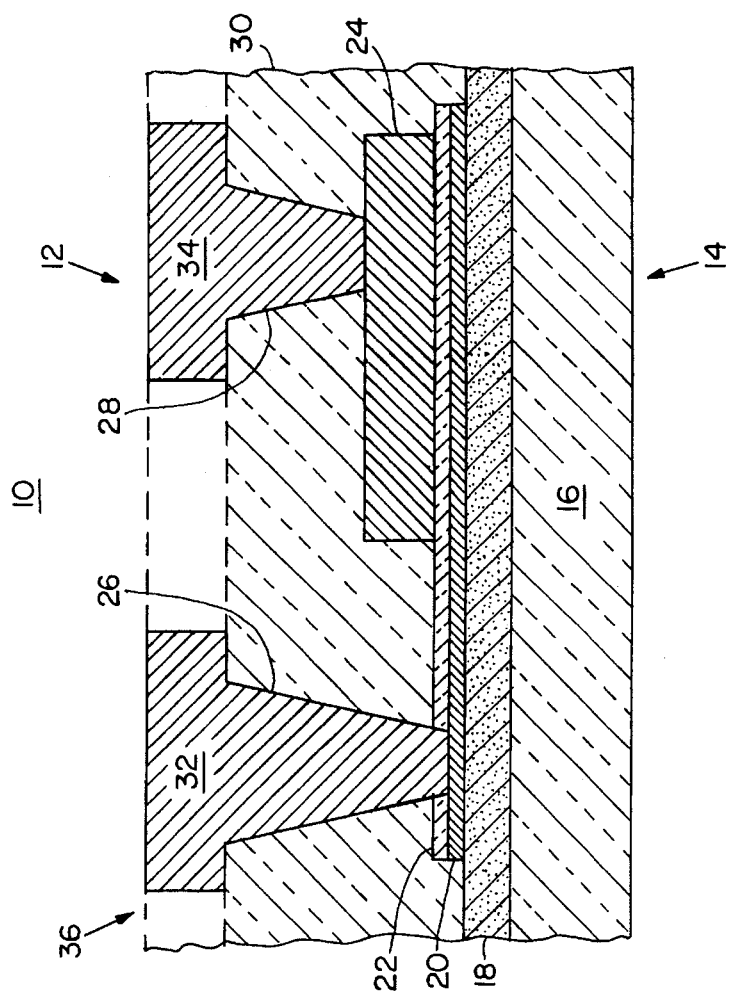

Other objects, features and advantages will occur to those skilled in the art from the following description of a preferred embodiment and the accompanying drawings, in which:

FIG. 1 is a side elevational diagrammatic cross sectional view of a metal-oxide-metal capacitor according to this invention; and FIG. 2 is a schematic block diagram of the method of forming the metal-oxide-metal capacitor of this invention.

The integrated circuit metal-oxide-metal capacitor of this invention is accomplished using a support layer which may for example include a substrate such as silicon with a field oxide such as silicon dioxide covering one surface. A first conductive electrode is established on the support layer or on the field oxide carried by the substrate. This first conductive electrode may be a metal. The metal may be a refractory metal such as titanium, tungsten or a combination of titanium and tungsten, chromium or hafnium. In fact, any metal that can be deposited with a smooth surface and which has a melting point higher than subsequent processing temperatures is usable. The first conductive electrode could also be made of an intermetallic compound: that is, a compound which is a combination of a metal and a nonmetal that has properties of both, such as titanium nitride. A dielectric film, such as silicon dioxide, tantalum pentoxide, silicon nitride, barium titanate, or other similar elements or combinations thereof, is deposited on the first conductive electrode in a layer as thin as 1,000 Å or less. This very thin layer is permitted because the titanium or similar material of the first conductive electrode is very smooth. A second conductive electrode is disposed on the dielectric film. This second conductive electrode is formed as a part of the first level metallization interconnect layer of the integrated circuit. The second conductive electrode may be made of aluminum, aluminum alloys, silicon, copper, gold, or combinations of the above, and it may include an adhesion layer such as titanium or titanium tungsten, or a diffusion barrier such as platinum, or both. The first and second conductive electrodes have a dielectric film between them to define the elemental capacitor. The interlevel dielectric layer is typically formed of silicon dioxide.

To fabricate the integrated circuit metal-oxide-metal capacitor of this invention, a first conductive electrode is deposited on an insulating surface such as the field oxide on the surface of a substrate. This deposition may be done by sputtering, vacuum evaporation, chemical vapor deposition (CVD) or any other methods that are well known in the art. A dielectric film is deposited on that first conductive electrode using sputtering, vacuum evaporation and CVD of either the low pressure or the plasma type. All the different depositing actions can be done by sputtering, vacuum evaporation, vapor deposition or any other suitable technique. The first conductive electrode and the dielectric film are patterned. The patterning may be done after each deposition step or to the complete stack after both deposition steps have taken place. That is, the first conductive electrode can be patterned after it is deposited but before the dielectric film is deposited, and then the dielectric film can be patterned after it is deposited. Or, the patterning of both can take place after the deposition of the first conductive electrode and the deposition of the dielectric film. The second conductive electrode is deposited and patterned on the dielectric film and also serves as the first level metallization interconnect layer of the integrated circuit itself. The interlevel dielectric layer of the integrated circuit is deposited and first and second vias are formed through the interlevel dielectric layer to reach each of the first and second conductive electrodes, respectively. These are the same vias used normally to connect the first and second level metals when such connections are desired. The depositing and patterning of the second level metallization interconnect layer of the integrated circuit also acts to fill the vias and defines terminals for the electrodes to establish contact with the rest of the integrated circuit.

There is shown in FIG. 1 a portion of an integrated circuit 10 including the metal-oxide-metal capacitor 12 according to this invention. Support layer 14 includes silicon substrate 16 and field oxide 18, silicon dioxide. A first conductive electrode 20 of titanium is carried on field oxide layer 18 and a dielectric film 22 such as oxide, or tantalum pentoxide, is carried on the first conductive electrode 20. The first level metallization interconnect layer, which serves generally to interconnect the emitters, collectors and bases of the various transistors of the integrated circuit, also functions in this invention to form the second conductive electrode 24 which together with the first conductive electrode 20 and dielectric film 22 constitute the elemental capacitor. First and second openings or vias 26 and 28 and interlevel dielectric layer 30 of integrated circuit 10 provide paths to the first 20 and second 24 conductive electrodes. Thus when the second level metallization interconnect layer 36 of integrated circuit 10 is formed, the metal flows into vias 26 and 28 forming conductive paths 32 and 34, respectively, creating terminals that interconnect their respective electrodes 20 and 24 to the rest of the integrated circuit 10.

Metal oxide metal capacitor 12 is formed most efficiently by the method according to this invention as shown in FIG. 2. Initially the first conductive electrode is deposited in step 50 onto a support. Then in step 52 the dielectric film is deposited on that first conductive electrode. The first conductive electrode may be patterned immediately after it is deposited as shown in step 54, before the dielectric film is deposited. Or both the first conductive electrode and the dielectric film may be patterned at the same time in step 56 after the dielectric film has been deposited in step 52. The second conductive electrode may be formed as a part of the first level metallization of the integrated circuit and patterned along with that, step 58. The integrated circuit interlevel dielectric layer is deposited in step 60 and vias are formed in step 62 to create paths to the first and second conductive electrodes. These vias are filled with conductive material to form terminals in step 64 simultaneously and as a part of the deposit and patterning of the second level metallization interconnect layer of the integrated circuit.

Although specific features of this invention are shown in some drawings and not others, this is for convenience only as some feature may be combined with any or all of the other features in accordance with the invention.

Other embodiments will occur to those skilled in the art and are within the following claims:

What is claimed is:

1. An integrated circuit metal-oxide-metal capacitor comprising:

a support layer;

a first conductive electrode on the support layer;

a dielectric film on said first conductive electrode;

a second conductive electrode disposed on said dielectric film and formed from a first level metallization interconnect layer of the integrated circuit to form a capacitor;

an interlevel dielectric layer;

a first contact via extending through said interlevel dielectric layer and said dielectric film to said first conductive electrode;

a second contact via extending through said interlevel dielectric layer to said second conductive electrode; and first and second terminals, formed from a second level metallization interconnect layer of the integrated circuit, contacting the first and second vias, respectively.

2. The integrated circuit metal-oxide-metal capacitor of claim 1 in which said support layer is an electrical insulator.

3. The integrated circuit metal-oxide-metal capacitor of claim 2 in which said electrical insulator is silicon dioxide.

4. The integrated circuit metal-oxide-metal capacitor of claim 2 in which said electrical insulator is a semi-insulating semiconductor.

5. The integrated circuit metal-oxide-metal capacitor of claim 4 in which said semi-insulating semiconductor is gallium arsenide.

6. The integrated circuit metal-oxide-metal capacitor of claim 1 in which said support layer includes a substrate with an electrical insulator layer on one surface.

7. The integrated circuit metal-oxide-metal capacitor of claim 6 in which said substrate is silicon.

8. The integrated circuit metal-oxide-metal capacitor of claim 1 in which said first conductive electrode is a metal.

9. The integrated circuit metal-oxide-metal capacitor of claim 8 in which said metal of said first conductive electrode is a refractory metal.

10. The integrated circuit metal-oxide-metal capacitor of claim 9 in which said refractory metal is from the group including titanium, tungsten and titanium tungsten.

11. The integrated circuit metal-oxide-metal capacitor of claim 1 in which said first conductive electrode is an intermetallic compound.

12. The integrated circuit metal-oxide-metal capacitor of claim 11 in which said intermetallic compound is titanium nitride.

13. The integrated circuit metal-oxide-metal capacitor of claim 1 in which said dielectric film is silicon dioxide.

14. The integrated circuit metal-oxide-metal capacitor of claim 1 in which said second conductive electrode and first level metallization interconnect layer includes aluminum.

15. The integrated circuit metal-oxide-metal capacitor of claim 1 in which said first conductive electrode extends beyond said second conductive electrode.

16. A method of fabricating an integrated circuit metal-oxide-metal capacitor comprising:

depositing a first conductive electrode on an electrically insulating surface;

depositing a dielectric film on said first conductive electrode;

patterning the first conductive electrode and the dielectric film;

depositing on said dielectric film and patterning a second conductive electrode formed from a first level metallic interconnect layer of the integrated circuit;

depositing the interlevel dielectric layer of the integrated circuit;

forming first and second vias through the interlevel dielectric layer to each of the first and second conductive electrodes, respectively; and depositing and patterning a second level metallization interconnect layer of the integrated circuit to fill the vias and define terminals for the electrodes to establish contact with the rest of the integrated circuit.

17. The method of claim 16 in which the patterning of the first conductive electrode and dielectric film occur together.

18. The method of claim 16 in which the patterning of the first conductive electrode occurs before the depositing of the dielectric film and the patterning of the dielectric film occurs after its depositioning.

* * * * *